(12) United States Patent
Takenaka

(10) Patent No.: US 6,859,540 B1
(45) Date of Patent: Feb. 22, 2005

(54) NOISE REDUCTION SYSTEM FOR AN AUDIO SYSTEM

(75) Inventor: Yoshihiko Takenaka, Saitama-ken (JP)

(73) Assignee: Pioneer Electronic Corporation, Tokyo (JP)

(*) Notice: Subject to any disclaimer, the term of this patent is extended or adjusted under 35 U.S.C. 154(b) by 0 days.

(21) Appl. No.: 09/123,453

(22) Filed: Jul. 28, 1998

(30) Foreign Application Priority Data

Jul. 29, 1997 (JP) .............................. 9-217969

(51) Int. Cl.[7] .......................... H04B 15/00; G10H 7/00
(52) U.S. Cl. .................... 381/94.3; 381/94.1; 381/94.2; 84/315; 84/321
(58) Field of Search .............................. 381/94.3, 94.1, 381/94.2; 84/615, 621, 633, 653, 665

(56) References Cited

U.S. PATENT DOCUMENTS

| | | | | |
|---|---|---|---|---|
| 5,416,847 A | * | 5/1995 | Boze ........................... 381/94 |
| 5,485,524 A | * | 1/1996 | Kuusama et al. .......... 381/94.3 |
| 5,615,270 A | * | 3/1997 | Miller et al. ................... 381/57 |
| 5,617,472 A | * | 4/1997 | Yoshida et al. ......... 379/390.02 |
| 5,789,689 A | * | 8/1998 | Doidic et al. .................. 84/603 |
| 5,838,800 A | * | 11/1998 | Lowe et al. .................... 381/1 |
| 6,035,048 A | * | 3/2000 | Diethorn ..................... 381/94.3 |
| 6,097,820 A | * | 8/2000 | Turner ....................... 381/94.3 |
| 6,125,288 A | * | 9/2000 | Imai .......................... 381/94.1 |
| 6,167,139 A | * | 12/2000 | Kim ........................... 381/102 |
| 6,445,800 B1 | * | 9/2002 | Nishiguchi et al. ........... 381/74 |

* cited by examiner

*Primary Examiner*—Minsun Oh Harvey
*Assistant Examiner*—Laura A. Grier
(74) *Attorney, Agent, or Firm*—Arent Fox PLLC

(57) ABSTRACT

Dividing devices are provided for dividing an input information signal into a plurality of frequency bands, and a level detector is provided for detecting a level of a noise component of the information signal divided by the dividing device. A plurality of thresholds corresponding to the divided information signals are stored in a memory. One or more thresholds are selected from the threshold stored in the memory based on a detected result by the level detector. Attenuators are provided for comparing the information signals with a selected threshold and for attenuating an information signal the level of which is lower than the selected threshold.

4 Claims, 8 Drawing Sheets

NOISE REDUCTION SYSTEM FOR AN AUDIO SYSTEM

BACKGROUND OF THE INVENTION

The present invention relates to a noise reduction system provided in a sound reproducing system.

A tape deck is provided with a noise reduction system wherein the level of sounds in middle to high frequency range where tape hiss is most objectionable, is compressed at recording and expanded at reproduction of the sounds.

In the noise reduction system, the music signals must be controlled both at recording and at reproduction. In addition, the noise reduction cannot be carried out at the reproduction unless the signals are compressed at the recording.

In consideration to these problems, the applicant of the present patent application has proposed an effective noise reduction system in Japanese Patent Application No. 8-139535. In the system, a signal reproduced from a recording medium is divided into frequency bands of a predetermined number. In each frequency band, the sound level of the reproduced signal is compared with a predetermined threshold, which corresponds to a noise level in music signals. When the level of the reproduced signal is lower than the threshold, the reproduced signal is deemed a noise, not a music signal. Therefore the reproduced signal is removed. The divided reproduced signal is thus processed in each frequency band, and thereafter, added together so as to be outputted as the music signal.

Although it is possible to use the noise reduction system at a recording of the music signal on a recording medium, there occurs the following problems. Namely, the level of noise component, and the distribution of the noise component in a frequency range largely differ dependent on the recording level, that is, input level of the signal, and the adjusted level of volume at recording, and also on the type of the music signal which is to be recorded. In addition, if the music signal source is a tape deck, the method for reducing the noises at recording further affects the level of the distribution of the noise components. In case of a tuner, the noise level correspondingly changes as the receiving conditions change.

Hence, when only one threshold is used, the noise reduction system cannot respond to various changes in conditions, so that the noise cannot be sufficiently reduced. Furthermore, the noise level fluctuates as in double breezing noise, thereby causing auditory problems.

Moreover, the frequency response of the noise differs depending on the type of the music signal. When the noises in all kinds of music signals are reduced in accordance with the threshold for a uniform frequency response, the problems described above also occur.

SUMMARY OF THE INVENTION

An object of the present invention is to provide a noise reduction system wherein noise in a music signal is sufficiently reduced when recording the signal on a recording medium.

According to the present invention, there is provided a noise reduction system for an audio system comprising, dividing means for dividing an input information signal into a plurality of frequency bands, level detector means for detecting a level of a noise component of the information signal divided by the dividing means, memory means storing a plurality of thresholds corresponding to the divided information signals, selector means for selecting one or more thresholds from the threshold stored in the memory means based on a detected result by the level detector means, attenuator means for comparing the information signals with a selected threshold and for attenuating an information signal the level of which is lower than the selected threshold.

The selection of the threshold is performed based on a minimum level of the information signal for a predetermined period.

These and other objects and features of the present invention will become more apparent from the following detailed description with reference to the accompanying drawings.

DETAILED DESCRIPTION OF THE PREFERRED EMBODIMENT

Figure 1:
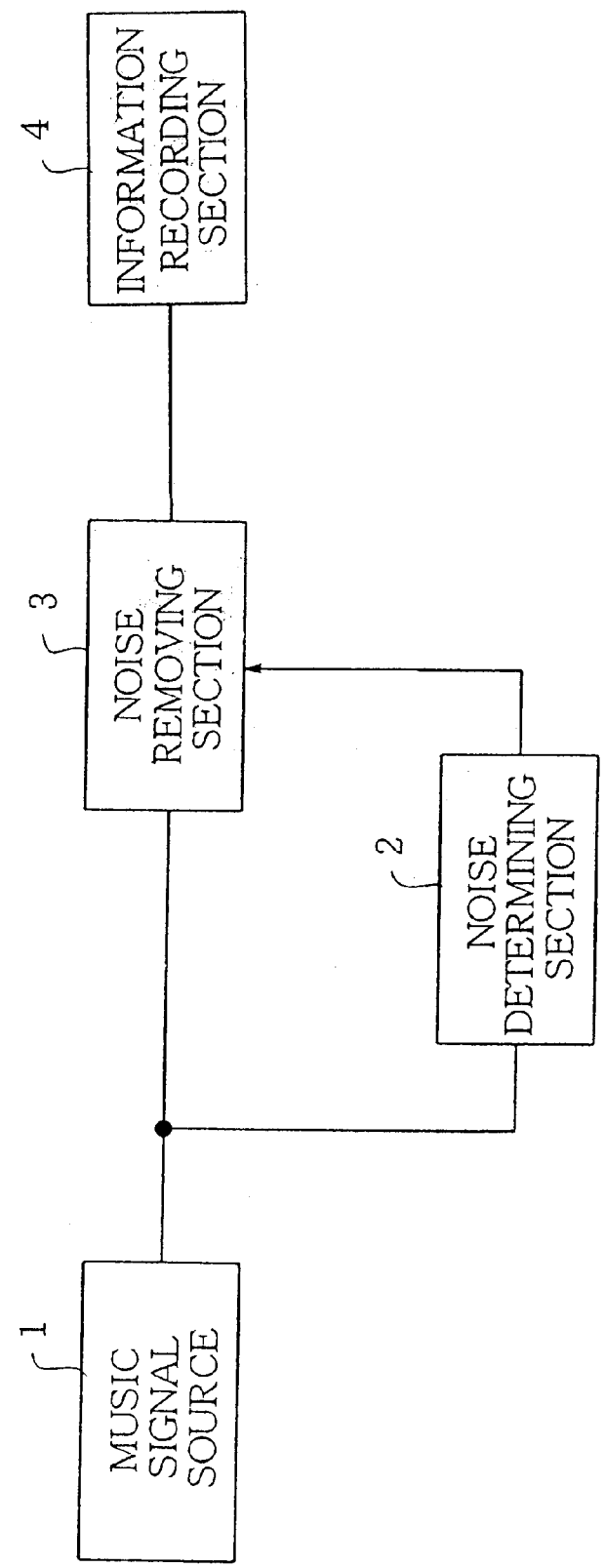
FIG. 1 is a block diagram conceptually showing a noise reduction system of the present invention.

Referring to FIG. 1, a sound signal is reproduced from a music signal source 1 as an information signal source. The music signal source 1 is, for example, a compact disc player and cassette tape deck, in which cases, the music signal is a reproduced information signal reproduced from a recording medium. The music signal source 1 may further be a communication device such as a tuner where the music signal is a demodulated information signal.

The music signal is applied to a noise determining section 2 where the characteristic and the level of noise included in the music signal is detected. The noise determining section 2 mainly comprises a noise level detector, noise characteristic detector and a memory wherein various noise characteristics and a threshold corresponding to each noise characteristic are stored.

The music signal from the source 1 is further applied to a noise removing section 3. A threshold read out from the memory in the noise determining section 2 is also fed to the noise removing section 3 so that the noise in the music signal is removed dependent on the threshold. The noise removing section 3 basically has the same construction as that provided in the noise reduction system disclosed in Japanese Patent Application No. 8-139535. The parts that differ will be later described in detail.

The music signal removed of the noises is applied to an information recording section 4 such as a cassette tape deck and a Minidisc player, wherein the music signal is recorded on a recording medium.

The operation of the noise detecting section 2 and noise removing section 3 will be described in detail.

Figure 2:
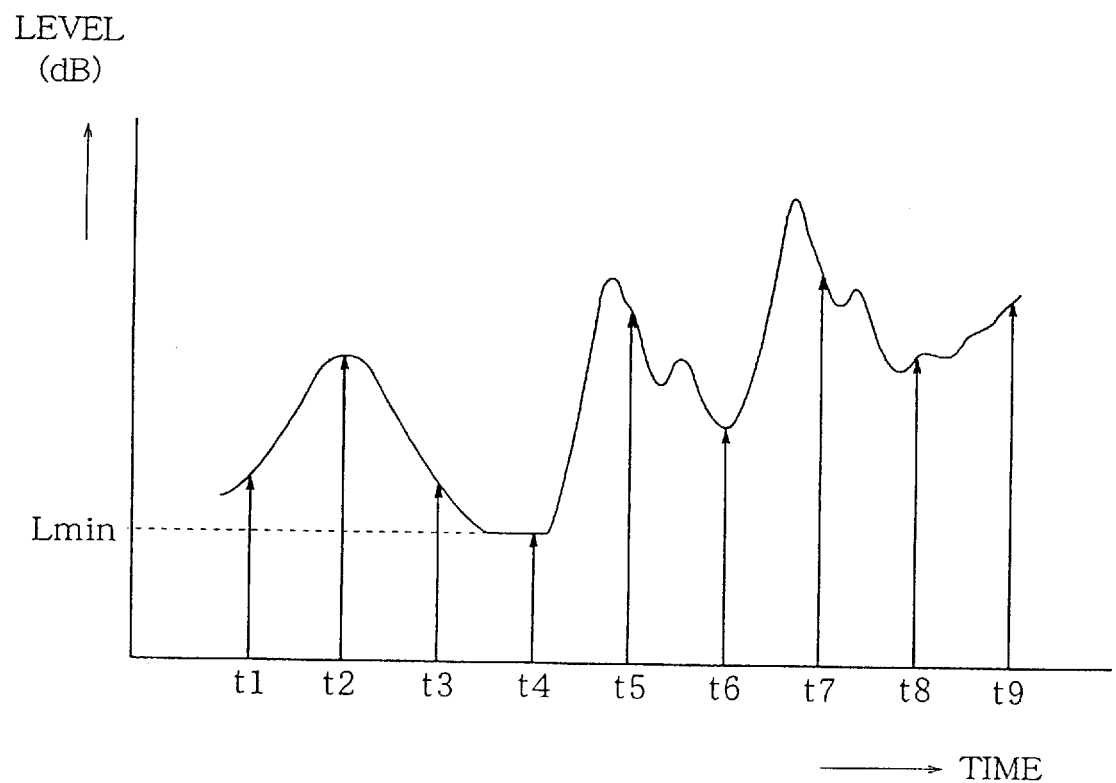
FIG. 2 is a graph showing a characteristic of an example of a music signal.

The music signal as an information signal is rarely a continuous high level signal such as a single signal. The music signal is generally a pulsating signal as shown in FIG. 2 instead. Particularly in a high frequency range of the information signal, such a characteristic is enhanced. In such a music signal, there exists in various places a non-sound portion which includes none of the original components of the music signal. The signal level detected in such a portion, that is, a period of time, can be deemed as a noise level.

FIG. 2 shows such a music signal in a frequency band, wherein the abscissa indicates time and the ordinate indicates decibels (dB) shown in logarithmic scale. During the period starting from a time t1 to time t9, the level Lmin at a time t4 is the lowest level. Thus the minimum level Lmin is determined as a noise level, so that a threshold for determining the reduction of noise can be selected.

Namely, in the present invention, the signal level of the information signal is monitored for a predetermined period of time to determine the minimum level within the period. The minimum level is stored in a memory as the noise level. The characteristics of the information signal is determined based on the noise level in each frequency band, and whether to attenuate the information signal is determined by comparing the signal level with the threshold.

The noise determining section 2 is now described in detail with reference to FIG. 3.

Figure 3:
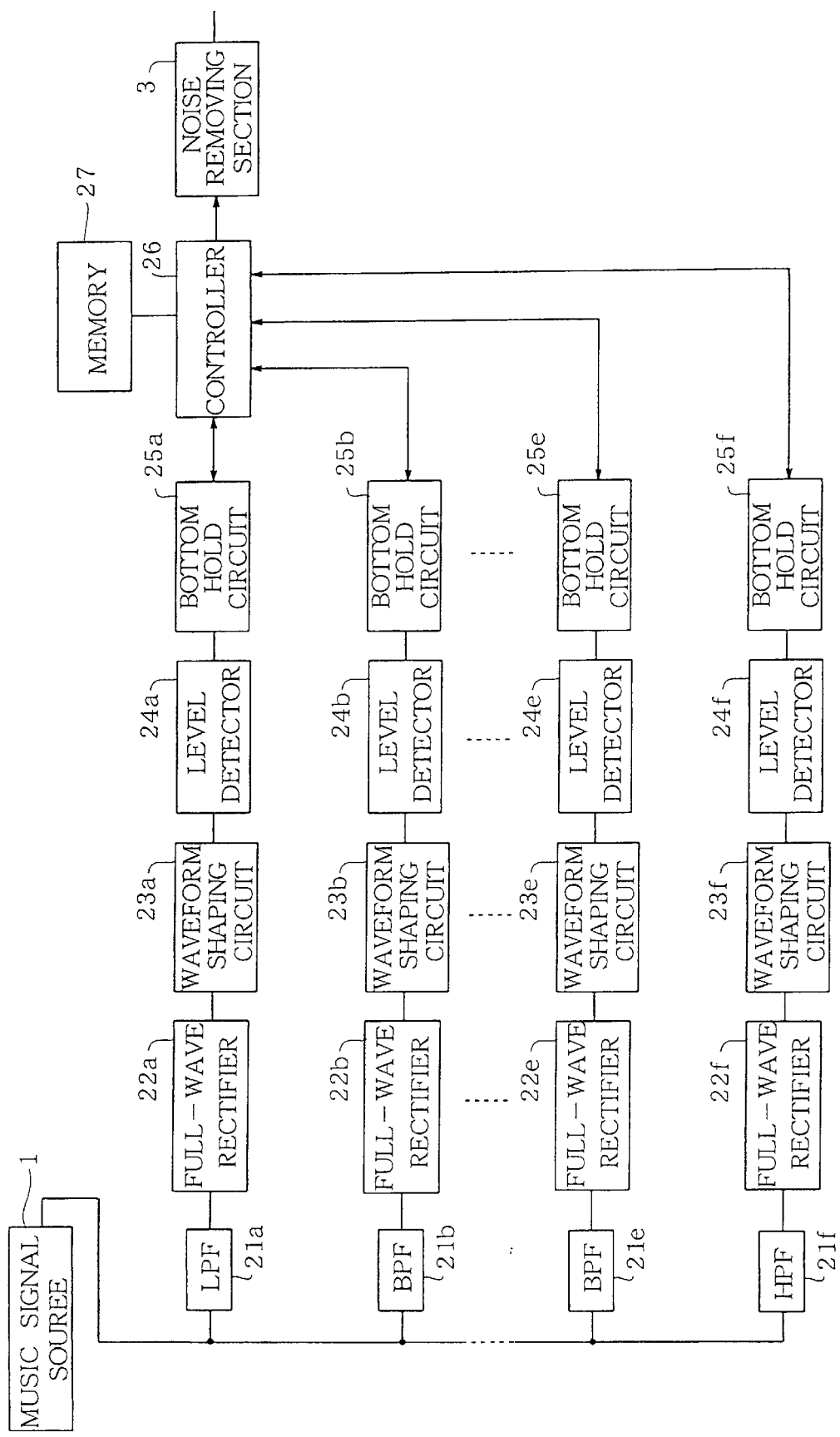
FIG. 3 is a block diagram of a noise determining section provided in the noise reduction system of the present invention.

Referring to FIG. 3, the music signal from the music signal source 1 is applied to a low-pass filter 21a, band-pass filters 21b to 21e, and a high-pass filter 21f so as to divide the signal into a plurality bands in accordance with the frequency thereof.

The output of the low-pass filter 21a is applied to a full-wave rectifier 22a so as to be converted into a direct current signal. The direct current signal is applied to a waveform shaping circuit 23a which is a low-pass filter, thereby imparting the signal with a time constant for determining the attack time and the release time of the control operation. The signal is further applied to a level detector 24a wherein a signal level of the output of the waveform shaping circuit 23a is detected.

At the waveform shaping circuit 23a, the time constant for the attack time and the release time is set so that a sudden change in the signal level is prevented. When there is a sudden change, the level detector 24a, for example, cannot detect the signal level, or when the signal is too quickly attenuated, the output sound is suddenly decreased, thereby giving a jolt to a listener.

The level detector 24a to the contrary to a so-called peak-hold circuit, is set to respond quickly when the level of the signal is decreased and to respond slowly when the level is increased. The minimum level detected by the level detector 24a is fed to a bottom hold circuit 25a which holds the minimum signal level for a predetermined period.

The noise determining section 2 is further provided with full-wave rectifiers 22b to 22f, waveform shaping circuits 23b to 23f, level detectors 24b to 24f, and bottom hold circuits 25b to 25f for the respective frequency bands.

The minimum signal levels from the bottom hold circuits 25a to 25f are fed to a controller 26. Dependent on the minimum signal levels, the controller 26 selects a pattern data of a noise in each frequency band having a characteristic and level which are the most similar to those of the noise signal included in the applied music signal. A plurality of such pattern data are stored in a memory 27. A threshold predetermined for the selected pattern data is also read out from the memory 27 and applied to the noise removing section 3.

More particularly, the memory 27 stores a plurality of noise patterns each having different noise characteristics for each of the frequency bands. The minimum signal levels applied from the bottom-hold circuits 25a to 25f are compared with the noise levels of the noise patterns to determine the most similar pattern. The threshold corresponding to the selected noise pattern is determined for each frequency band. The thresholds may be stored in the memory 27 in the form of equations, a look-up table, or in any other forms.

The controller 26 holds the output of each of the bottom-hold circuits 25a to 25f for a predetermined period, for example, two to three seconds. The held signals are considered as the minimum level of the signal in each frequency band, and compared with the threshold stored in the memory 27.

A minimum level determining operation described above is started at the time the music signal is started to be outputted, that is, when a tape is reproduced in the case where the music signal source 1 is a tape deck, when a tuner is selected in the case where the music signal source 1 is a tuner, or when the information recording section 4 is set ready for recording, or the recording is started.

When the minimum level determining operation is set in response to a signal indicating the transmission from a music signal source 1 as described above, and after the elapse of a predetermining period for allowing the minimum noise level to be held in the bottom-hold sections 25a to 25f, the controller 26 operates to determine the appropriate thresholds based on the noise levels and feeds them to the noise removing sections 3.

Although the controller 26 is, for example, a circuit comprising a microprocessor unit (MPU) in the present embodiment, a controller having other constructions may be employed.

In the present embodiment, each of the bottom-hold circuits 25a to 25f is operated to hold the minimum level at all times. However, the operation and non-operation of the bottom-hold circuits may be controlled by a signal from the controller 26.

The above described controller 26 is adapted to be applied with only the effective comparison results by controlling the timing for applying the minimum levels.

In the noise removing section 3, the noises in the music signal from the music signal source 1 is attenuated dependent on the thresholds fed from the controller 26. The attenuating operation is the same as that employed in the conventional noise reduction system described in Japanese Patent Application No. 8-139535.

Namely, when a signal, the level of which is lower than the threshold is applied, the signal is attenuated at a ratio other than 1:1, for example, 1:2. More particularly, if the level of the input signal is lower than the threshold by 3 dB, the signal is compressed so as to be attenuated by 6 dB. If the input signal is lower by 6 dB, the signal is compressed so as to be attenuated by 12 dB.

The noise removing section 3 has attenuating means for each frequency bands. The signals of the respective frequency bands are attenuated, and thereafter synthesized together to form one signal which is to be recorded.

The range where the attenuation is carried out is basically the range where the signal levels are approximate to the hiss noise level.

Figure 4:
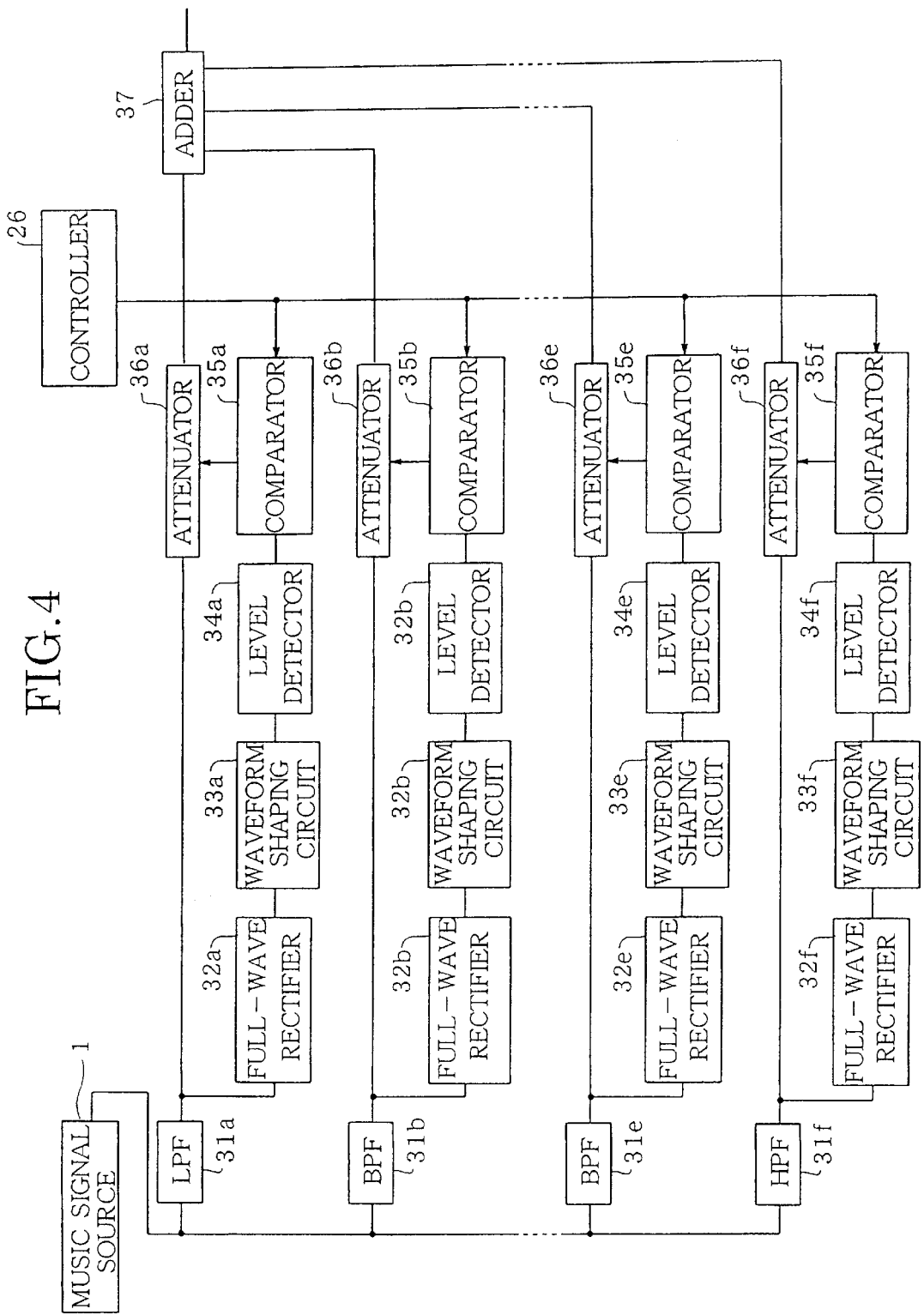
FIG. 4 is a block diagram of a noise removing section provided in the noise reduction system of the present invention.

Referring to FIG. 4 describing the noise removing section 3 in detail, the music signal from the music signal source 1 is applied to a low-pass filter 31a, band-pass filters 31b to 31e, and a high-pass filter 31f so as to divide the signal into four bands in accordance with the frequency thereof.

The output of the low-pass filter 31a is applied to a full-wave rectifier 32a where the signal is rectified so that the level thereof is detected. The rectified signal is applied to a waveform shaping circuit 33a which is a low-pass filter, thereby imparting the signal with a time constant for determining the attack time and the release time of the attenuation for the same reason as explained with regard to the waveform shaping circuit 23a. The signal is further applied to a level detector 34a wherein a signal level of the output of the waveform shaping circuit 33a is detected. The signal level is fed to a comparator 35a.

The comparator 35a is applied with the threshold determined by the controller 26 of FIG. 3 so that the signal level from the level detector 34a is compared with the threshold. The output of the comparator 35a is fed to an attenuator 36a.

When the output signal level is higher than the threshold, the attenuator 36a is not operated. On the other hand, when the signal level is lower, the attenuator 36a attenuates the music signal.

The noise removing section 3 is further provided with full-wave rectifiers 32b to 32f, waveform shaping circuits 33b to 33f, level detectors 34b to 34f, comparators 35b to 35f, and attenuators 36b to 36f for signals in other frequency bands.

The attenuated signals from each of the attenuators 36a to 36f are all applied to an adder 37 wherein the signals are added and synthesized. Accordingly a music signal ranging across the entire frequency range is formed. The synthesized signal is fed to the information recording section 4 in FIG. 1 as the recording input signal for the MD player and tape deck.

The filters, full-wave rectifiers, and waveform shaping circuits in FIGS. 3 and 4 have the same constructions and operations so that they can be used in common.

The controller 26, memory 27 and the noise removing section 3 are connected to one another by bidirectional buses, thereby enabling a parallel processing, so that a complicated control operation can be carried out at a high speed. If a serial transfer is employed, the construction can be simplified although the processing speed is decreased. By using digital signal processors (DSPs), the processes can be executed in one operation.

Since it takes several seconds to detect the noise level, there is a time lag before the actual noise reduction is started, when the recording and the feeding of the music signal from the source are simultaneously started. If the noise reduction is abruptly started, there occurs a jolt in music between the part including the noises and the part without noises. Such a jolt can be prevented if the controller is operated to gradually increase the noise reduction effect, or to start the noise reduction when the input signal level is high.

When the recording is started after the signal from the music signal source 1 is applied, the minimum level of the input signal can be detected during the time lag. Thus, the signal which is removed of the noises is recorded from the beginning. Alternatively, the recording is temporarily interrupted by a pause operation, for example, so that the minimum level of the noise can be detected during the interruption, thereby enabling to obtain the same effect.

The operation of the present invention is described hereinafter with reference to FIG. 5.

Figure 5:
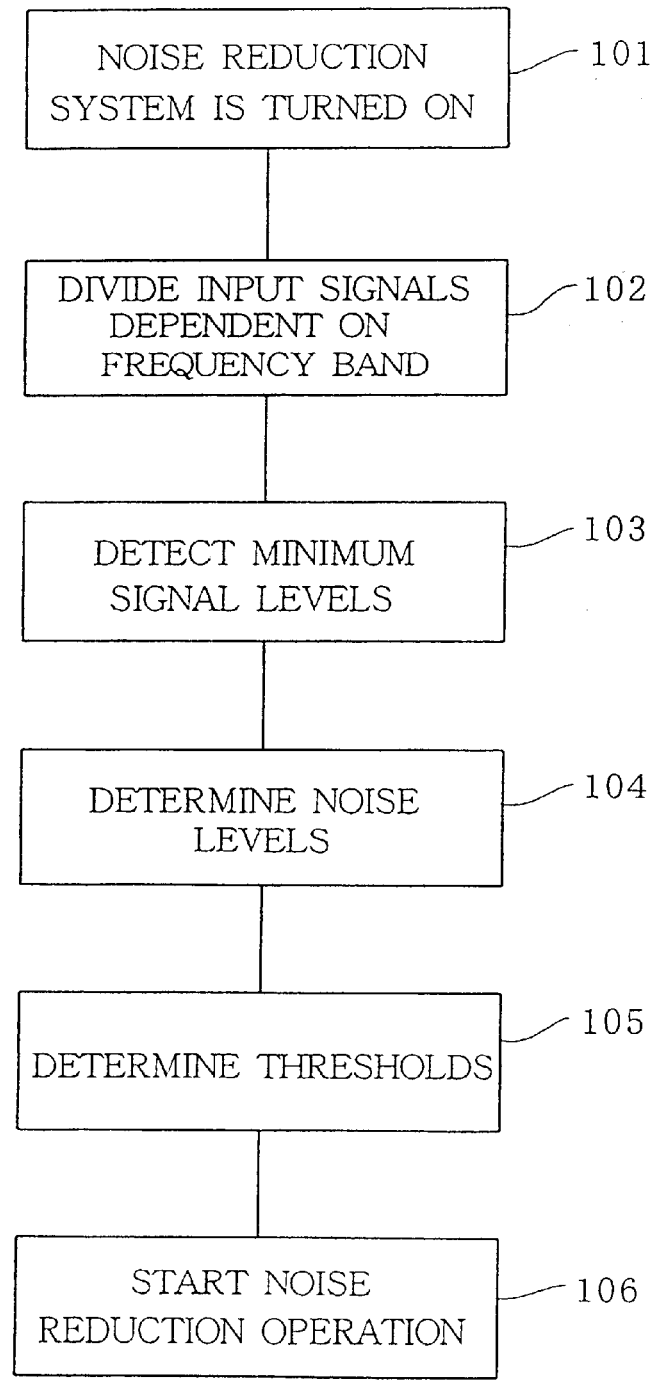
FIG. 5 is a flowchart describing the operation of the noise reduction system.

Referring to FIG. 5, when the noise reduction system is turned on at a step 101, the signal fed from the music signal source 1 is divided into a plurality of signals in a predetermined frequency bands by such means as digital filters comprising DSPs at a step 102. At a step 103, the minimum signal level within the predetermined period is detected in each frequency band, so that the noise level in each band is determined at a step 104. Thereafter at a step 105, in each frequency band, a pattern wherein a characteristic curve and the level thereof are the most similar to those of the input signal is selected based on the detected noise level. Hence, the thresholds for the selected patterns are determined.

The noise reduction is executed at a step 106 in accordance with the threshold determined at the step 105. Thus, the noise reduction appropriate for the noise characteristics of the input signal is carried out. As a result, a music signal of excellent quality having reduced noise is applied to a recording device (not shown).

Figure 6:
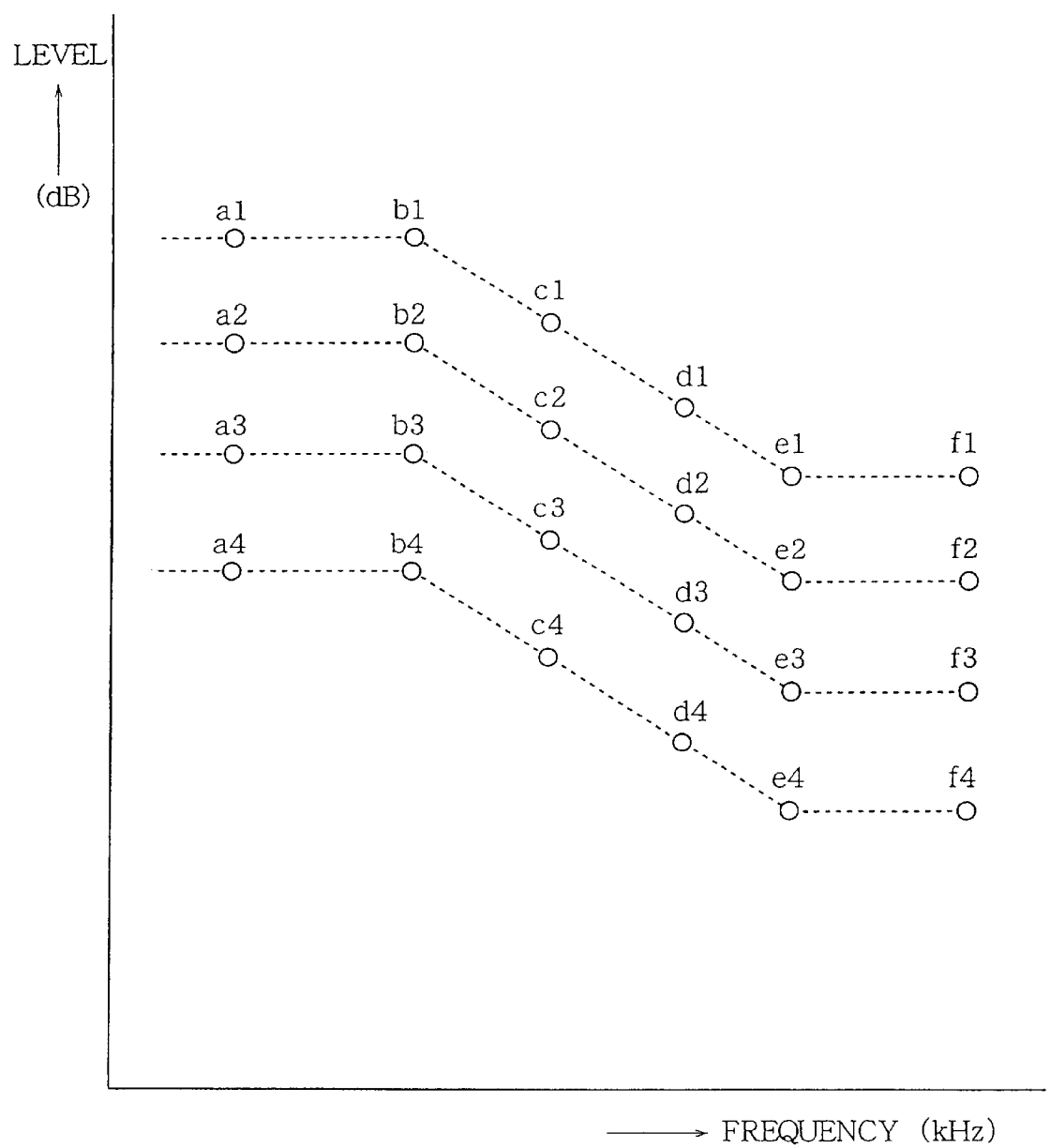
FIGS. 6 and 7 are graphs showing examples of thresholds in various frequency bands.
Figure 7:
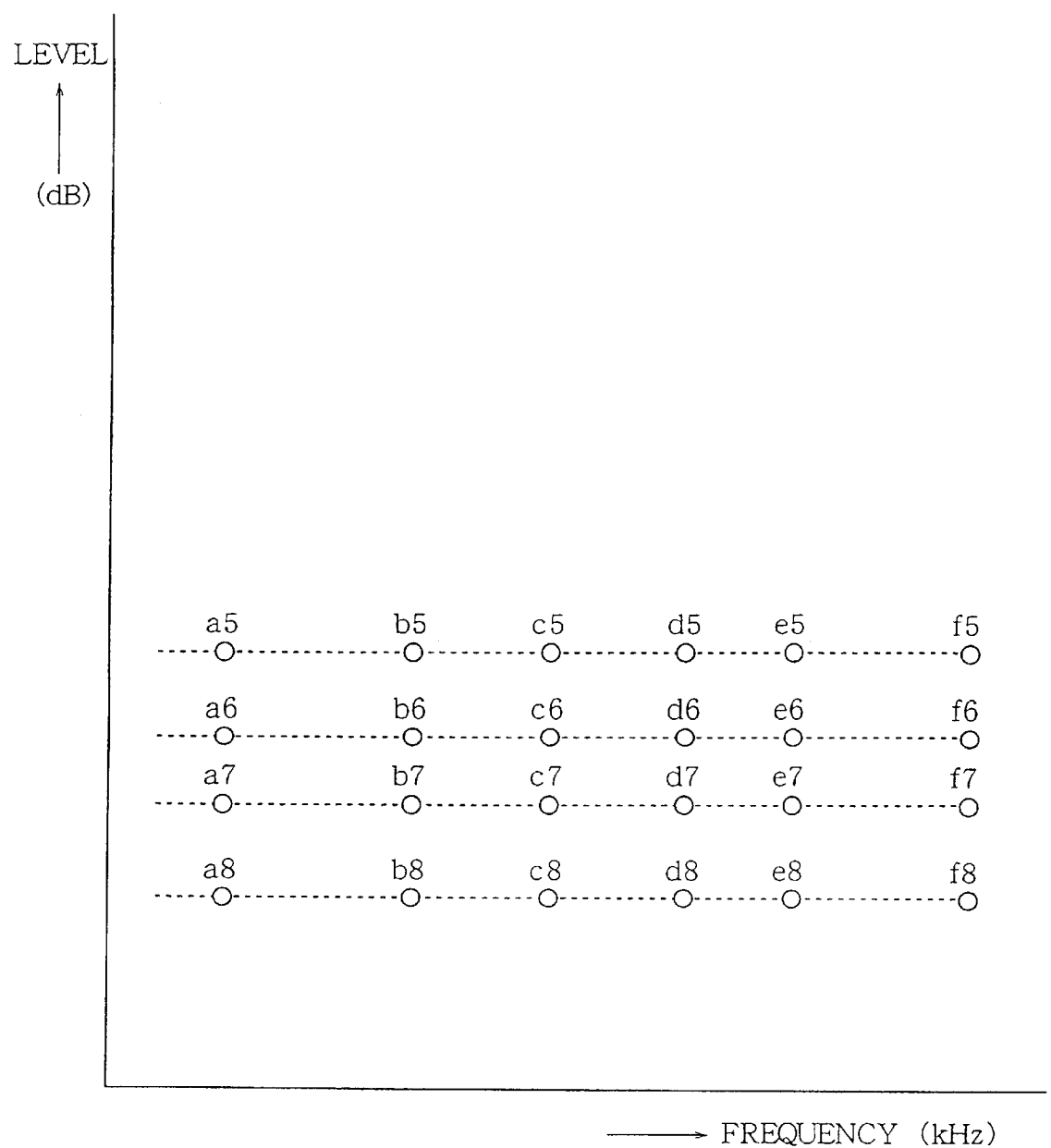

FIGS. 6 and 7 show thresholds for various frequency bands where abscissa and ordinate in each graph indicate frequencies and levels of the threshold in decibels, respectively.

In the graphs, thresholds f1 to f8 are for frequency band defined by the HPF 21f, and thresholds b1 to b4, c1 to c4, d1 to d4 and e1 to e4 are for the frequency bands defined by the BPFs 21b to 21f, respectively. Thresholds a1 to a4 are for the frequency band defined by the LPF 21a.

The thresholds a1 to f1, a2 to f2, a3 to f3, and a4 to f4 shown in FIG. 6 are thresholds of noise reducing characteristics in a tape deck. The thresholds a5 to f5, a6 to f6, a7 to f7, and a8 to f8 shown in FIG. 7 are thresholds of noise reducing characteristics for a tuner.

More particularly, the music signal reproduced from a tape has a noise level characteristic having the same curvature as the reproducing equalizer. In order to correspond to the characteristic, the threshold is set at a lower level as the frequency becomes higher. If the attenuation characteristics of the all of the bands are set the same, even the sound signals may be compressed, or the noise may be kept without being compressed in the band where the set attenuation characteristic is deflected from the actual noise level.

In the case of the tuner, the frequency response of the noise level is substantially flat so that the thresholds in all frequency bands are set at the same value.

Figure 8:
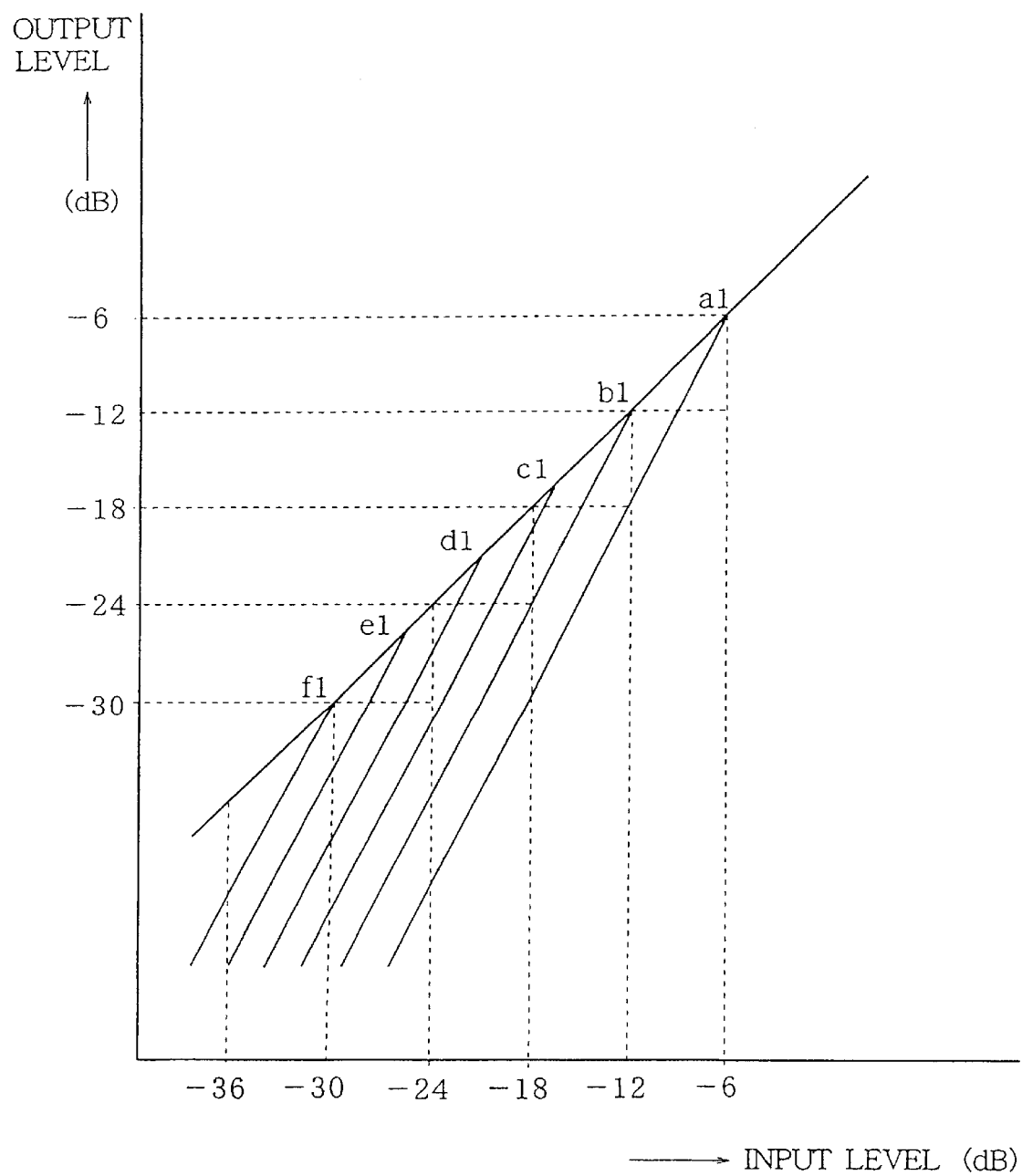
FIG. 8 is a graph showing attenuation characteristics in the noise reduction system of the present invention.

Referring to FIG. 8, showing an example of an attenuation characteristics of the attenuator 36a to 36f which correspond to the thresholds a1 to f1 of FIG. 6, the abscissa of the graph indicates the input signal level and the ordinate indicates the output signal level, both represented in decibels. The thresholds in FIG. 8 are selected in accordance with the output signal from the controller 26. As shown in FIG. 8, when the levels of the input signals fed to the attenuator 36a to 36f become lower than the threshold a1 to f1, the input signal is attenuated to restrain the noise level. On the other hand, if the input signal level is higher than the threshold, the signal is outputted without attenuation.

For example, if the input signal level of the threshold a1 for the frequency band corresponding to the LPF 31a shown in FIG. 4 is −6 dB, the input signal having an input level higher than the threshold a1 is outputted at the same level. On the other hand, if the input level of the input signal is −12 dB, which is lower than the level of the threshold a1, the signal is outputted at a level of −18 dB.

In the example described in FIG. 8, although the number of the thresholds is six to correspond to the respective frequency bands, the number can be increased, whereby the accuracy of the noise reduction is improved. Moreover, the ratio between the input and output signal in the noise reduction range need not be limited to 1:2.

The thresholds set for various noise patterns can be determined in accordance with the type of the music signal. For example, in the case where the music signal source 1 is a tuner, the thresholds can be set depending on whether the applied signal is an FM, AM, stereo, monaural, or a pulse code modulated (PCM) signal, so as to correspond to the characteristic thereof. In a tape deck, the thresholds can be set to stop the noise reduction, or set for Dolby B and Dolby C signal ("Dolby" is a registered trademark of Dolby Laboratories). When the signal source is a disc player, the medium played thereon may be an MD, digital video disc (DVD), video disc, or a CD. Furthermore, the music signal may be a combination of the signals reproduced from these discs and an output signals of a microphone and a personal computer. One threshold may be used for several noise patterns. In addition, the system can be customized by using thresholds set by the user.

The present invention may be further modified when applied to a system where the type of the noise can be selected beforehand instead of determining the noise characteristics based on minimum level of the noises. For example, when a mode for an FM stereo signal is selected, the corresponding threshold curve is determined. In a case where a signal indicating the conditions of the music signal is obtained, the threshold curve and the level thereof can be directly selected by the controller in accordance with the signal.

A more accurate noise reduction can be carried out if a plurality of thresholds are provided for one noise pattern. In addition, a threshold for a detected noise level may be shifted a predetermined quantity to provide a threshold for another noise level.

Although the devices provided in the system have been described to operate analogously, the operations may be digitally processed using such devices as DSPs, A/D converters, D/A converters and CPUs to obtain the same results.

The present invention may be applied to any recording device in addition to MD player and tape deck.

It may be inadvisable to carry out noise reduction depending on the contents of the applied signal. In order to deal with such a circumstance, the system is provided with a means for manually stopping the noise reduction.

The present invention may further applied to other signal processing operations than noise reduction at recording.

From the foregoing it will be understood that the present invention provides a noise reduction system where the operation is stable, and a sufficient noise reduction is achieved.

While the invention has been described in conjunction with preferred specific embodiment thereof, it will be understood that this description is intended to illustrate and not limit the scope of the invention, which is defined by the following claims.

What is claimed is:

1. A noise reduction system for an audio system comprising:
   dividing means for dividing an input information signal into a plurality of frequency bands;
   level detector means for detecting a level of a noise component of the information signal divided by the dividing means;
   memory means for storing a plurality of thresholds corresponding to the divided information signals;
   selector means for selecting one or more thresholds from the threshold stored in the memory means based on a detected result by the level detector means; and
   attenuator means for comparing the information signals with a selected threshold and for attenuating an information signal the level of which is lower than the selected threshold.

2. The system according to claim 1 wherein the selection of the threshold is performed based on a minimum level of the information signal for a predetermined period.

3. A noise reduction system for an audio system, comprising:
   dividing means for dividing an input information signal into a plurality of frequency bands;
   noise level detector means for detecting a level of a noise component of the information signal divided by the dividing means;
   determining means for determining a threshold in accordance with a detection result produced by the noise level detector means;
   attenuator means for comparing the information signals with a determined threshold and for attenuating information signals having a level lower than the determined threshold, wherein the determining means comprises: memory means storing a plurality of thresholds corresponding to a plurality of information signals; selector means for selecting one or more thresholds from the memory means in accordance with a detection result produced by the noise level detector means.

4. The noise reduction system according to claim 3, wherein a plurality of thresholds are stored in the memory means corresponding to the features of a plurality of input information signals.

* * * * *